(12) United States Patent  
Wilson et al.

(10) Patent No.: US 10,852,574 B2  
(45) Date of Patent: Dec. 1, 2020

(54) TRANSPARENT COATINGS WITH MULTILAYER FLAKE PIGMENTS

(71) Applicant: Apple Inc., Cupertino, CA (US)

(72) Inventors: James R. Wilson, Cupertino, CA (US); Matthew S. Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 34 days.

(21) Appl. No.: 15/912,317

(22) Filed: Mar. 5, 2018

(65) Prior Publication Data

US 2018/0373085 A1 Dec. 27, 2018

Related U.S. Application Data

(60) Provisional application No. 62/523,605, filed on Jun. 22, 2017.

(51) Int. Cl.
*G02F 1/1333* (2006.01)
*G02F 1/135* (2006.01)
(Continued)

(52) U.S. Cl.
CPC ...... *G02F 1/133305* (2013.01); *C03C 17/007* (2013.01); *C09C 1/00* (2013.01); *C09C 1/0015* (2013.01); *G02F 1/135* (2013.01); *H01L 27/3225* (2013.01); *H01L 51/529* (2013.01); *H01L 51/5253* (2013.01); *H01L 51/5284* (2013.01); *C03C 2217/485* (2013.01);
(Continued)

(58) Field of Classification Search
CPC . G02F 1/133305; C03C 17/007; C09D 5/004; C09C 1/0015; C09C 1/00
See application file for complete search history.

(56) References Cited

U.S. PATENT DOCUMENTS 4,090,773 A * 5/1978 Bauer ............. B29D 11/00596
359/359
6,391,400 B1 5/2002 Russell et al.
(Continued)

FOREIGN PATENT DOCUMENTS

EP 3168266 A1 5/2017
KR 1020100117978 A 4/2010
(Continued)

*Primary Examiner* — Lixi C Simpson
(74) *Attorney, Agent, or Firm* — Treyz Law Group, P.C.; G. Victor Treyz; David K. Cole

(57) ABSTRACT

Substrates such as transparent glass layers or other transparent substrates may be used to form protective display cover layers, windows, housing structures, camera windows, and other structures. Coatings may be formed on the substrates, on pixel arrays such as flexible organic light-emitting diode pixel arrays, housing structures, and other structures. The coatings may have optical properties arising from the inclusion of pigment flakes in a clear polymer binder. The pigment flakes may be formed from a thin-film interference layer. The thin-film interference filter layer may have a stack of dielectric layers with a pattern of refractive index values selected to adjust the optical properties of the pigment flakes. The stack of dielectric layers may be configured to form an infrared-light-blocking-and-visible-light-transmitting optical characteristic for the coatings and/or may have other desired spectral properties.

18 Claims, 8 Drawing Sheets

(51) Int. Cl.
   *H01L 27/32* (2006.01)
   *C03C 17/00* (2006.01)
   *H01L 51/52* (2006.01)
   *C09C 1/00* (2006.01)
   *H01L 51/00* (2006.01)

(52) U.S. Cl.
   CPC .. *C03C 2217/74* (2013.01); *G02F 2001/1351* (2013.01); *H01L 51/0097* (2013.01); *H01L 2251/5338* (2013.01)

(56) References Cited

U.S. PATENT DOCUMENTS

| | | | |
|---|---|---|---|
| 6,635,342 B1* | 10/2003 | Ben-Zvi | B32B 27/20 428/323 |
| 6,815,065 B2 | 11/2004 | Argoitia et al. | |
| 8,583,187 B2 | 11/2013 | Kim et al. | |
| 8,749,529 B2 | 6/2014 | Powell et al. | |
| 2003/0224164 A1* | 12/2003 | Argoitia | C09C 1/0024 428/403 |
| 2010/0328955 A1* | 12/2010 | Cunningham | H01K 1/18 362/293 |
| 2014/0022629 A1* | 1/2014 | Powell | G06K 19/0614 359/350 |
| 2014/0028596 A1* | 1/2014 | Seo | G06F 3/0487 345/173 |
| 2015/0168618 A1* | 6/2015 | Nakajima | B32B 7/02 359/359 |
| 2015/0286327 A1* | 10/2015 | Chakrabarti | G06F 3/041 359/352 |
| 2018/0088413 A1* | 3/2018 | Jang | G02F 1/133509 |
| 2019/0031889 A1* | 1/2019 | Fujita | B32B 7/02 |

FOREIGN PATENT DOCUMENTS

| | | |
|---|---|---|
| WO | 1995017479 | 6/1995 |
| WO | 2007054379 A1 | 5/2007 |

\* cited by examiner

US 10,852,574 B2

TRANSPARENT COATINGS WITH MULTILAYER FLAKE PIGMENTS

This application claims the benefit of provisional patent application No. 62/523,605, filed Jun. 22, 2017, which is hereby incorporated by reference herein in its entirety.

FIELD

This relates generally to coatings and, more particularly, to coatings having flake pigments.

BACKGROUND

It may sometimes be desirable to form a coating on a transparent substrate. For example, coatings are sometimes formed on display cover glass layers. Coatings can also be formed on windows in buildings and vehicles.

If care is not taken, coatings will not have desired properties. For example, light transmission and reflection spectra may not be as desired, substrate strength may be compromised due to the presence of a deposited coating, and/or coating uniformity will be poor due to factors such as substrate curvature.

SUMMARY

Substrates such as transparent glass layers or other structures may be used to form protective display cover layers, windows, housing structures, camera windows, and other structures. Coatings may be formed on glass display substrates, on pixel arrays such as flexible organic light-emitting diode pixel arrays, on housing structures, on windows, and on other structures. For example, an infrared-light-blocking-and-visible-light-transmitting coating may be formed on a display layer or other substrate such as a curved substrate or flexible pixel array.

Coatings may be formed from a polymer binder that includes pigment flakes. The pigment flakes may be formed by breaking a thin-film interference layer into flakes. Each flake may include a stack of dielectric layers with a pattern of refractive index values selected to adjust the optical properties of the flake. The stack of dielectric layers may be configured to form an infrared-light-blocking-and-visible-light-transmitting optical characteristic for a coating or to provide a coating with other desired spectral properties such as an ultraviolet-light-blocking characteristic.

Coatings formed from polymer with pigment flakes may be applied with uniform thickness to curved substrates such as curved windows using liquid polymer coating techniques such as spraying, printing, and dipping, may be applied to glass layers without reducing glass strength, and may be sufficiently flexible to accommodate display flexing (e.g., when the coating is applied to an array of organic light-emitting diode pixels that flexes as a flexible device housing is bent).

DETAILED DESCRIPTION

Coatings may be applied to substrates such as clear substrates of glass, plastic, ceramic, crystalline materials such as sapphire, and/or other substrate materials. The coatings may be used to reduce reflections, to adjust transmission and reflection spectra for the substrate, to change the visual appearance of the substrate (e.g., to impart opacity and/or color at particular portions of the light spectrum), and/or to otherwise adjust the optical properties of the substrate and any item into which the substrate is incorporated. Substrates may form parts of displays or housing structures in electronic devices, may form windows, and/or may form other items. In some configurations, substrates may have curved cross-sectional profiles.

Figure 1:
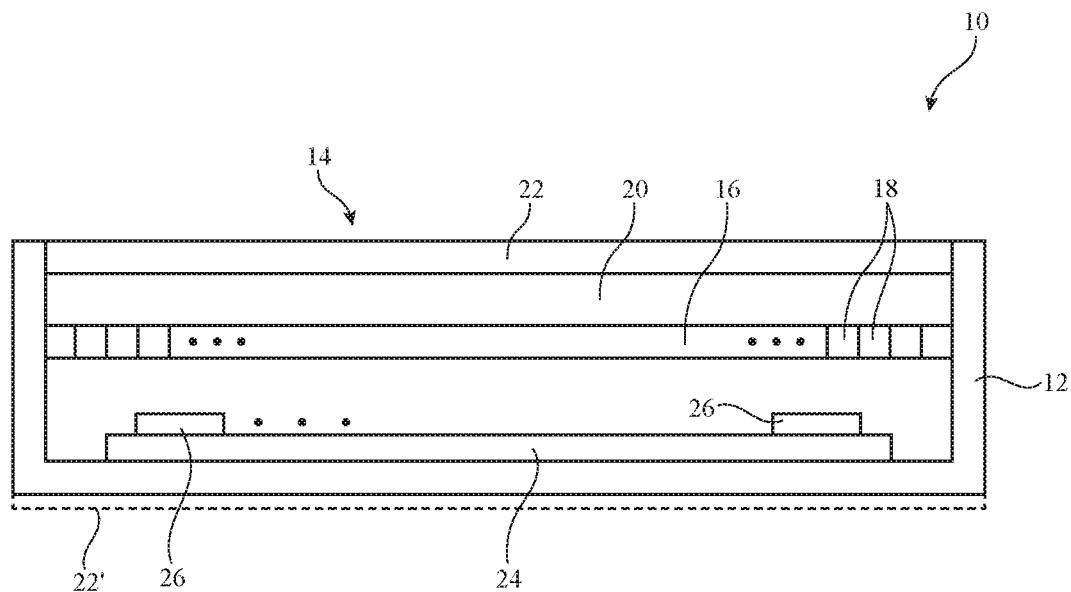
FIG. 1 is a cross-sectional side view of an illustrative electronic device having a display with a coating in accordance with an embodiment.

A cross-sectional side view of an illustrative electronic device of the type that may include substrates with coatings is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

As shown in FIG. 1, device 10 may include components such as display 14. Display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may, if desired, have multiple portions (e.g., first and second rigid portions that are coupled by a hinge).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may have a pixel array such as pixel array 16 with an array of pixels 18 and may be protected using an optional display cover layer such as display cover layer 20. Display cover layer 20 is transparent, so that images on pixel array 16 may be viewed by a user through display cover layer 20 and any transparent coating on layer 20 during operation. Coatings may be formed on display cover layer 20. Coatings may also be formed on pixel layer 16. Pixel array 16 may be a liquid crystal display pixel array, an organic light-emitting diode pixel array, a pixel array formed from crystalline semiconductor dies forming light-emitting diode pixels, or other display structures. Display cover layer 20 may be formed from clear glass or other transparent materials (e.g., plastic, ceramic, sapphire or other crystalline materials, etc.). In some configurations for device 10, display 14 may be omitted. The arrangement of FIG. 1 in which device 10 includes display 14 is merely illustrative.

As shown in the cross-sectional side view of electronic device 10 of FIG. 1, electronic device 10 may include internal device components such as devices 26. Devices 26 may include sensors, integrated circuits, buttons, connectors, and other circuitry and may be mounted on one or more substrates such as substrate 24. Substrate 24 may be a dielectric carrier such as a molded plastic carrier or a printed circuit. For example, substrate 24 may be a printed circuit such as a rigid printed circuit formed from a material such as fiberglass-filled epoxy or may be a flexible printed circuit formed from a sheet of polyimide or other flexible polymer layer.

To adjust the optical properties of structures in device 10, one or more of the surfaces of the structures in device 10 may be coated with a coating. The coating may have a binder such as a polymer binder and may contain pigments such as flake pigments. The flake pigments may be formed from pieces of a thin-film interference layer and may adjust the optical properties of the applied polymer coating. As shown in FIG. 1, this type of coating (coating 22 of FIG. 1) may be applied to a substrate layer such as display cover layer 20. If desired, coatings such as coating 22 may be applied to other structures in device 10 such as an exposed sidewall or rear wall surface of housing 12 (see, e.g., illustrative coating 22' on the rear surface of device 10). In general, coatings such as coating 22 may be applied to outer and/or inner surfaces of substrate 20 or other layers of material (opaque and/or transparent) in device 10 (e.g., housing walls, display cover layers, camera windows, pixel arrays, trackpad members, and/or other structures). In configurations in which coating 22 overlaps display 14, coating 22 may be used to help block infrared light and therefore reduce thermal loading on display 14 from ambient light, while coating 22 is also sufficiently transparent to visible light wavelengths to allow light from pixel array 16 to pass through coating 22 (e.g., so that images on pixel array 16 are visible to a user).

Figure 2:
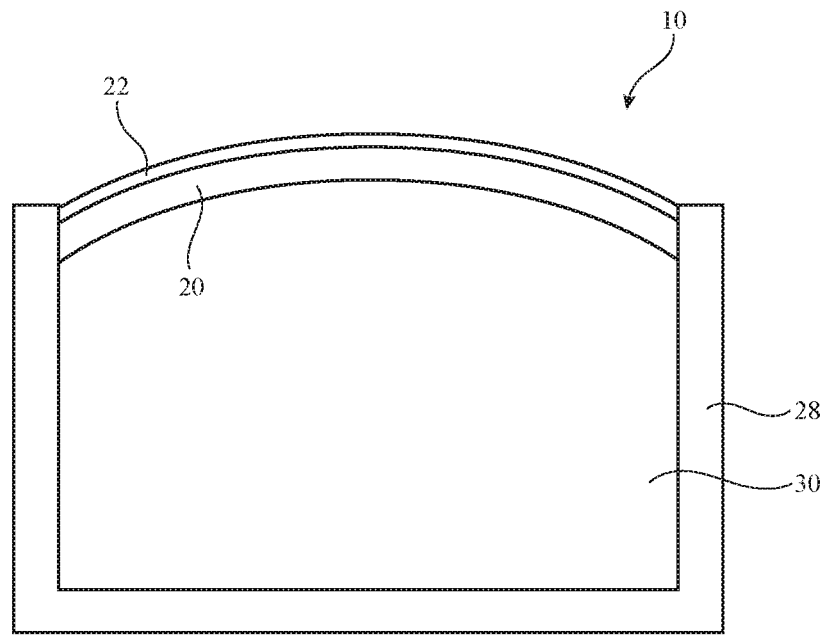
FIG. 2 is a cross-sectional side view of a portion of an illustrative enclosure having a curved window with a coating in accordance with an embodiment.

FIG. 2 is a cross-sectional side view of an illustrative enclosure 28 with a window formed from a coated transparent substrate (e.g., substrate 20 with coating 22). Enclosure 28 may be a structure such as a wall in a building or a body of a vessel (boat, automobile or other vehicle, plane, etc.). Enclosure 28 and the window formed from substrate 20 may enclose interior region 30 (e.g., the inside of a building, vehicle, etc.). In some configurations, enclosure 28 may be opaque and the presence of transparent substrate 20 may help allow ambient light to enter interior 30. Coating 22 may be formed on the inside or outside of substrate 20 (e.g., to form an infrared-light-blocking-and-visible-light-transmitting coating and/or other optical coating). As shown in FIG. 2, substrate 20 may have a curved cross-sectional profile and therefore may form a convex or concave surface. Coating 22 may be deposited by printing, spraying, dipping, or other coating techniques that are suitable for curved surfaces. In some embodiments, curved substrate 20 of FIG. 2 may be a curved display cover layer for a wristwatch (e.g., to cover a display on the front face of the watch) and enclosure 28 may be an electronic device housing (e.g., a body of a wristwatch).

Figure 3:
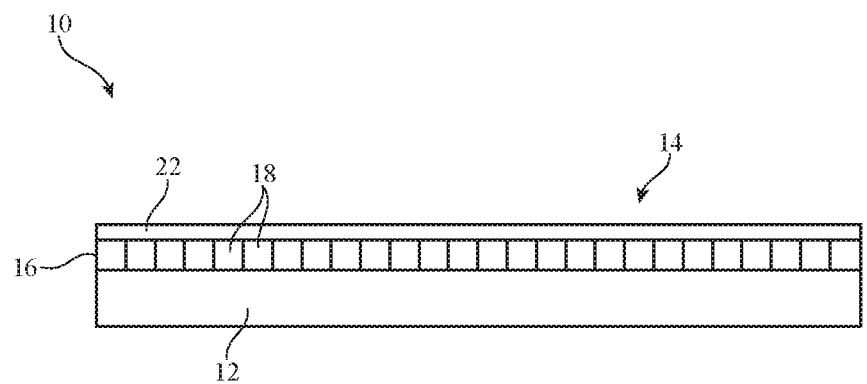
FIGS. 3, 4, and 5 are cross-sectional side views of an illustrative foldable electronic device having a display with a coating in accordance with an embodiment.
Figure 4:
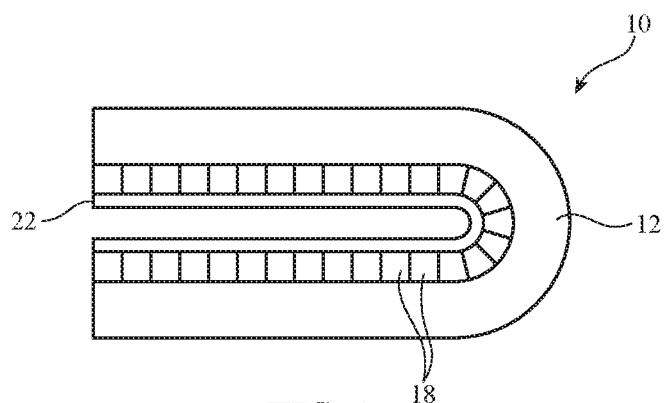
Figure 5:
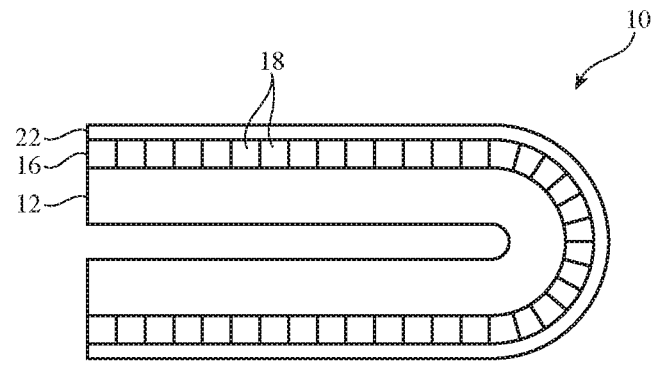

FIGS. 3, 4, and 5 illustrate how device 10 may be a bendable device having a flexible display. As shown in FIG. 3, display 14 of device 10 may be formed from pixel array 16. Pixel array 16 may be a flexible layer with organic light-emitting diode pixels 18 or other pixels and may be covered with coating 22 (e.g., with or without using a display cover layer such as layer 20 of FIG. 1). In configurations in which the display cover layer is omitted, pixel array 16 may serve as a substrate onto which coating 22 is deposited. Housing 12 may be formed from a flexible material, a material with a flexible portion (e.g., an elastomeric portion overlapping a bend axis), and/or hinge structures. These structures may allow housing 12 to bend (e.g., into a face-to-face display configuration of the type shown in FIG. 4 and/or into a back-to-back display configuration of the type shown in FIG. 5). Coating 22 (e.g., a coating on pixel array 16 and/or a coating on housing 12 or other layer(s) in device 10) may be formed from a polymer containing flake pigments and may be sufficiently flexible to withstand bending during use without cracking or delaminating (see, e.g., FIGS. 4 and 5).

The structures of FIGS. 1, 2, 3, 4, and 5 include illustrative substrates (housing walls, building walls, vehicle body structures, electronic device display cover layers, windows, etc.) onto which coating 22 may be applied. If desired, coatings such as coating 22 may be applied to other structures. The structures of FIGS. 1, 2, 3, 4, and 5 are merely illustrative.

Coating 22 may be configured to block and/or transmit light such as infrared light, visible light, and/or ultraviolet light. As an example, infrared-light-blocking coatings can be used to reduce heat loading in electronic devices, to prevent sunlight from overly heating the interior of a building or vehicle, to prevent infrared ambient light from adversely affecting image sensor performance in a camera, and/or to perform other infrared-light-blocking functions. As another example, visible light transparency for coating 22 may be used to ensure that a camera window is sufficiently transparent to allow a camera to capture satisfactory image, may be used for a display to ensure that the display is efficient and does not overly absorb visible light, may be used to ensure that a window for a building or vehicle is sufficiently transparent for normal use, may be used to ensure that images on a display are visible to a user, etc. In some situations (e.g., building and vehicle windows, device housing applications, etc.) it may be desirable to partially block visible light (e.g., to reduce light transmission by 10%, 50%, or other suitable amount). Ultraviolet light blocking (e.g., reducing the light transmission to less than 50%, less than 25%, or less than 2% at wavelengths of 310-400 nm or other suitable ultraviolet wavelengths) may be used to protect vulnerable components (e.g., pixels 18 in display 14 such as organic light-emitting diode pixel in pixel array 16) and/or may be used to reduce human exposure to ultraviolet light.

By using thin-film interference filter designs for flake pigments in coating 22, coating 22 may be provided with desired spectral properties (e.g., a desired light transmission spectrum, a desired light reflection spectrum, and/or a desired light absorption spectrum).

Figure 6:
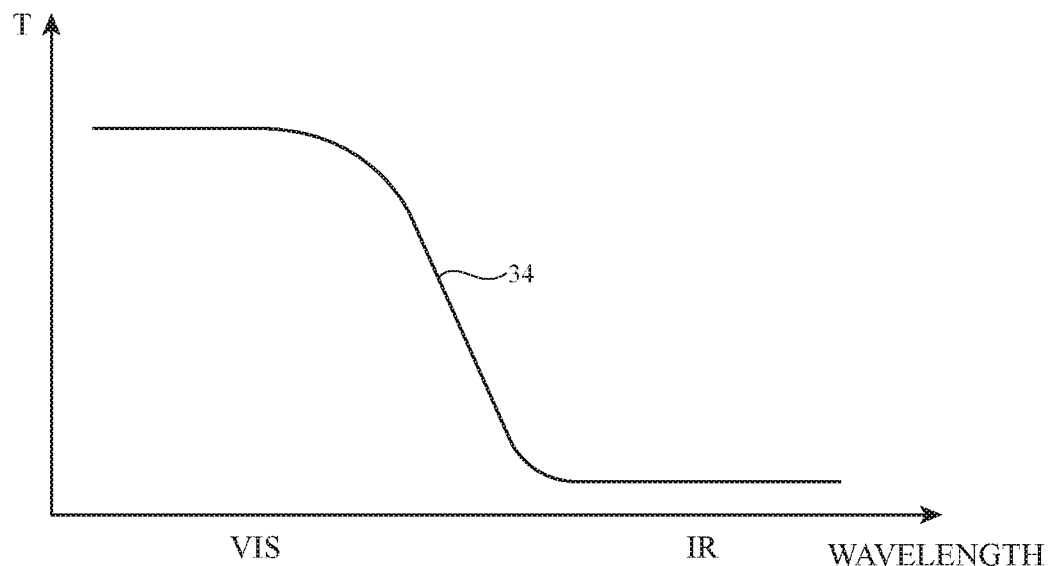
FIG. 6 is a graph of light transmission as a function of wavelength for an illustrative coating in accordance with an embodiment.
Figure 7:
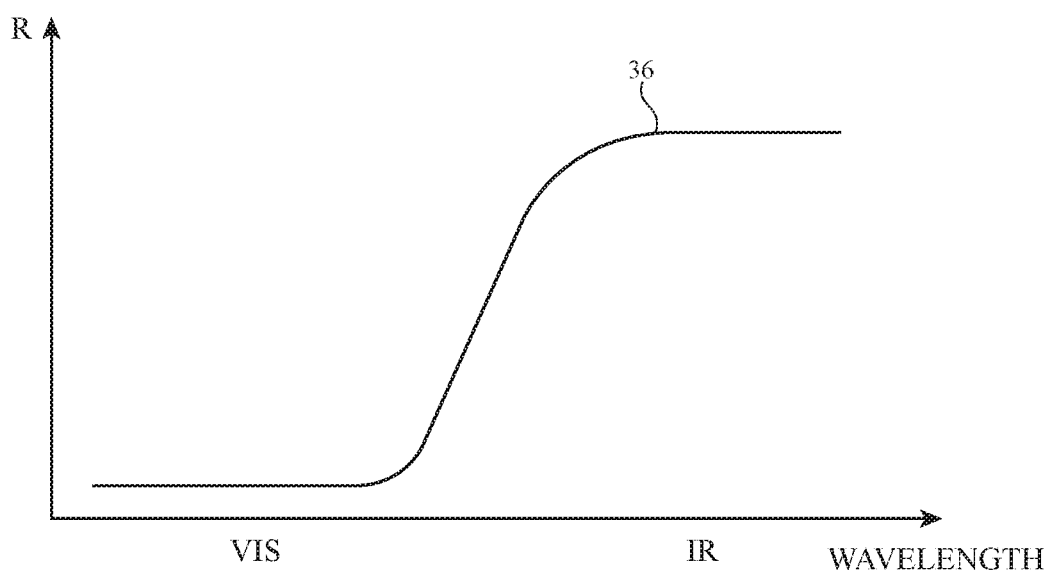
FIG. 7 is a graph of light reflectivity as a function of wavelength for an illustrative coating in accordance with an embodiment.

In the example of FIG. 6, light transmission T of an illustrative coating 22 has been plotted as a function of wavelength for infrared and visible light wavelengths. The corresponding reflectivity R of coating 22 of FIG. 6 is shown in FIG. 7. In this example, coating 22 is an infrared light-blocking-and-visible-light-transmitting coating. This type of coating may block infrared light (e.g., light at a wavelength of 700 nm or longer than 700 nm such as light at 700-2500 nm) so that transmission T is less than 50%, less than 25%, less than 1%, at least 0.01%, or other suitable amount and so that reflectivity R is at least 50%, at least 75%, at least 99%, less than 99.99%, or other suitable amount. Ultraviolet light may be blocked in this way as well, if desired. This type of coating may also exhibit a visible light transmission (e.g., at 400-700 nm) of at least 50%, at least 75%, at least 99%, less than 99.99%, or other suitable amount and reflectivity R that is less than 50%, less than 25%, less than 1%, at least 0.01%, or other suitable amount. Light transmission T for an infrared-light-blocking-and-visible-light-transmitting configuration of coating 22 may, for example, be characterized by a transmission curve such as curve 34 of FIG. 6 and light reflection R for this coating 22 may, for example, be characterized by a reflectivity curve such as curve 36 of FIG. 7. Other coatings 22 may be formed, if desired (e.g., coatings that are transparent at one or more infrared light wavelengths, that block some or all visible light at certain wavelengths, and/or that transmit or reflect ultraviolet wavelengths).

The filtering properties of coating 22 (e.g., the light transmission spectrum of FIG. 6 and the light reflection spectrum of FIG. 7) may be implemented using pigment flakes formed from thin-film interference filter structures. The pigment flakes may be incorporated into a polymer binder to form coating 22. The polymer binder may initially be provided in uncured liquid form, allowing coating 22 to be deposited using deposition techniques such as spraying, printing (ink-jet printing, pad printing, screen printing, etc.), dipping, etc.

Figure 8:
FIG. 8 is a cross-sectional side view of a thin-film filter stack on a single side of a substrate in accordance with an embodiment.
Figure 9:
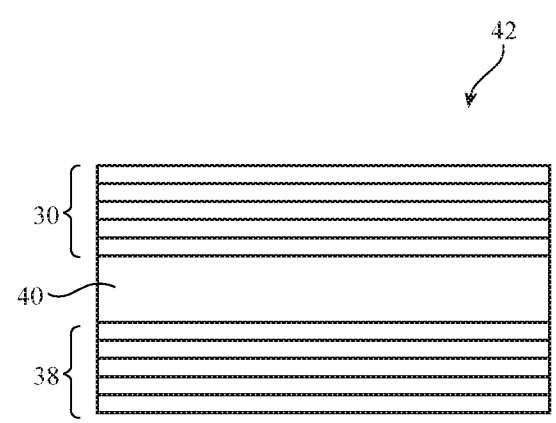
FIG. 9 is a cross-sectional side view of thin-film filter stacks on opposing sides of a substrate in accordance with an embodiment.
Figure 10:
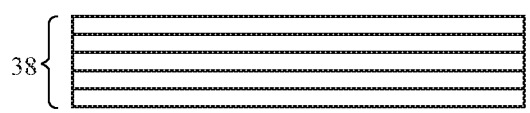
FIG. 10 is a cross-sectional side view of a thin-film filter stack following release of the stack from a release layer in accordance with an embodiment.

FIGS. 8, 9, and 10 how illustrative pigment material may be formed from thin-film interference filter structures. Thin-film interference filter layer 42 of FIGS. 8, 9, and 10 includes multiple thin-film layers such as layers 38 (e.g., layers of 0.05-1.5 microns in thickness, at least 0.1 microns in thickness, at least 0.15 microns in thickness, less than 1 micron in thickness, etc.). There may be at least two layers 38, at least three layers 38, at least four layers 38, at least five layers 38, at least seven layers 38, at least nine layers 38, or other suitable number of layers 38 in layer 42. Layers 38 may have any suitable thicknesses (e.g., quarter wavelength thicknesses, half-wavelength thicknesses, other sub-wavelength thicknesses, thickness of more than a wavelength, etc.).

In the example of FIG. 8, layers 38 form a thin-film interference filter on an upper surface of substrate 40. Substrate 40 may be formed from a layer of polymer (e.g., acrylic or other material with an index of refraction of about 1.5 or other suitable refractive index value), an inorganic dielectric layer, or other suitable substrate material (e.g., a layer of transparent polymer or inorganic material, etc.) and may have any suitable thickness (e.g., at least 0.1 microns, at least 0.5 microns, less than 10 microns, etc.). In the example of FIG. 9, layers 38 have been formed on opposing surfaces of substrate 40. If desired, substrate 40 may be removed during processing. This type of arrangement is shown in FIG. 10. As shown in FIG. 10, thin-film interference layer 42 may be formed from layers 38 that have been deposited on a release liner substrate and subsequently removed, thereby forming a stack of layers 38 for thin-film interference layer 42 that are not supported by substrate 40.

Layers 38 of FIGS. 8, 9, and 10 may include dielectric materials with different index of refraction values. The dielectric materials may include inorganic materials such as silicon oxide, titanium oxide, aluminum oxide, other metal oxides, silicon nitride, other nitrides, oxynitrides, or other inorganic materials and may include organic materials such as polymers. Each different material may have a different respective index of refraction. The thicknesses and indices of refraction of thin-film layers 38 in each thin-film interference filter layer may be configured to impart desired optical properties to layers 38 (e.g. to form mirror coating layers, to form infrared-light-blocking-and-visible-light-passing layers, to form layers that block ultraviolet light, to form layers with characteristics of the type show in FIGS. 6 and 7, etc.). The thin-film stacks of dielectric materials of differing index of refraction values (layers 38) may have alternating high-index-of-refraction and low-index-of-refraction values, patterns of layers with first, second, and third different indices of refraction and/or patterns of layers with four different refractive index values, etc. and may, in general, have any suitable transmission, reflection, and absorption spectral properties.

Figure 11:
FIG. 11 is a cross-sectional side view of an illustrative substrate in accordance with an embodiment.
Figure 12:
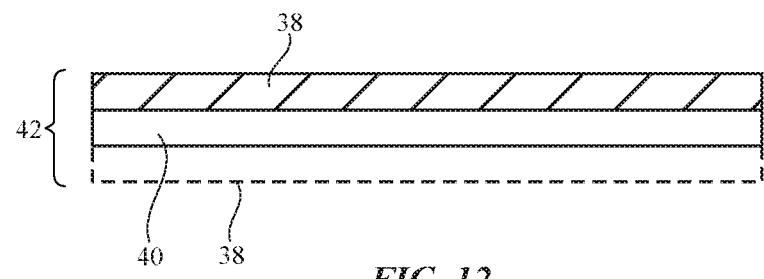
FIG. 12 is a cross-sectional side view of an illustrative flake pigment layer formed from one or more thin-film filter stacks on a substrate such as the substrate of FIG. 11 in accordance with an embodiment.
Figure 13:
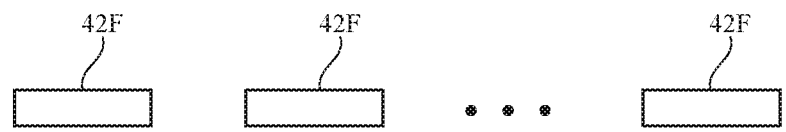
FIG. 13 is a cross-sectional side view of illustrative flake pigments formed by breaking up a flake pigment layer in accordance with an embodiment.

After forming a thin-film filter layer such as layer 42 of FIG. 8, 9, or 10, layer 42 may be broken into pigment flakes (e.g., by grinding, crushing, and/or other techniques). FIG. 11 shows how substrate 40 may appear before coating substrate 40 with layers 38. FIG. 12 shows how layer 42 may appear after coating one or both sides of substrate 40 with thin-film stacks formed from layers 38. Layers 38 may also be deposited on substrate 40 and subsequently released from substrate 40 to form layer 42 of FIG. 10. Layer 42 may serve as a layer of pigment material for forming pigment flakes for inclusion in coating 22. FIG. 13 shows illustrative pigment flakes 42F that have been formed by breaking up layer 42 into small pieces.

Figure 14:
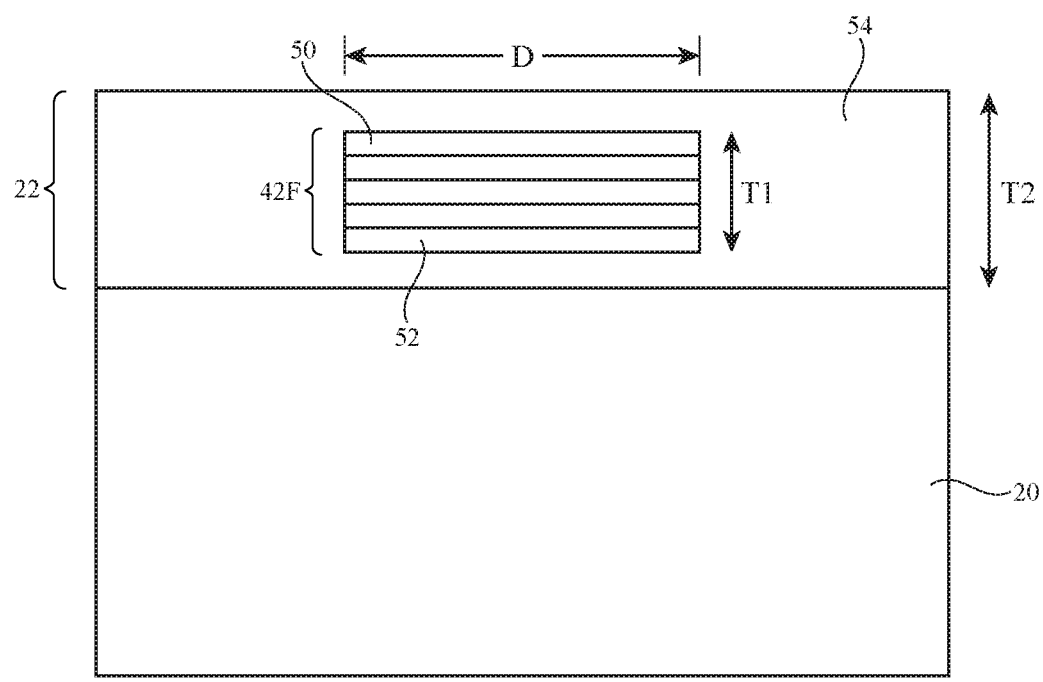
FIG. 14 is a cross-sectional side view of an illustrative pigment flake in a polymer binder layer on a substrate in accordance with an embodiment.

FIG. 14 shows how flakes such as illustrative flake 42F may be incorporated into polymer binder material 54 to form coating 22. Flakes such as flake 42F may have one or more layers (e.g. layers 38 of FIGS. 8, 9, and 10 and, if desired, substrate layer 40). Layers 38 may be configured to form thin-film interference filter structures that provide coating 22 with desired optical properties. Coating 22 may be formed on one or both sides of a supporting structure such as substrate layer 20 (e.g. a display cover layer, other display layers such as pixel array 16, housing layers such as a rear glass housing layer and/or housing sidewalls, a window in a building or vehicle, a camera window in an electronic device, or another suitable substrate layer).

Polymer binder 54 may initially be a liquid and may be solidified by thermal curing, ultraviolet light curing, or other curing techniques. After curing, flakes such as flake 42F will be held in place. Flake 42F may have a thin plate-like shape and polymer binder 54 may be applied in a relatively thin layer to substrate 20, so that flake 42F may tend to be oriented parallel to the surface of substrate 20 as shown in FIG. 14. With one illustrative configuration, the lateral dimensions D of flake 42F may be about 1-30 microns, at least 0.5 microns, at least 1 micron, at least 2 microns, at least 4 microns, at least 8 microns, at least 15 microns, at least 20 microns, less than 50 microns, less than 25 microns, or other suitable size. Thickness T1 of flake 42 may be about 0.5 to 4 microns, at least 0.5 microns, at least 0.3 microns, at least 1 micron, less than 5 microns, less than 3 microns, etc. (e.g. so that the aspect ratio D/T1 of flake 42 is at least 5, at least 10, at least 20, less than 5000, or other suitable value). The thickness T2 of polymer binder 54 and coating 22 may be at least 1 micron, at least 3 microns, at least 6 microns, at least 10 microns, at least 20 microns, less than 500 microns, less than 150 microns, or less than 50 microns (as examples).

Polymer binder 54 may be formed from clear acrylic, clear epoxy, or other clear polymer material and/or may be formed from a polymer layer or other material that includes dyes, particles of pigment, and/or other structures to impart a desired bulk optical property to binder 54 (e.g., a dye with a particular color cast, an opaque pigment such as carbon black, etc.). Configurations in which binder 54 is transparent may sometimes be described herein as an example.

Binder 54 may have an index of refraction of 1.4-1.55, at least 1.35, less than 1.6, or other suitable value. The refractive indices of outermost layers 52 and 50 in the dielectric thin-film stack of layers forming flake 42F may differ from that of layer 54, so that desired thin-film interference effects are achieved when flake 42F is immersed in polymer 54 (e.g., the index of refraction of layer 54 may be taken into account when determining a desired thin-film interference filter configuration for flakes 42F).

Figure 15:
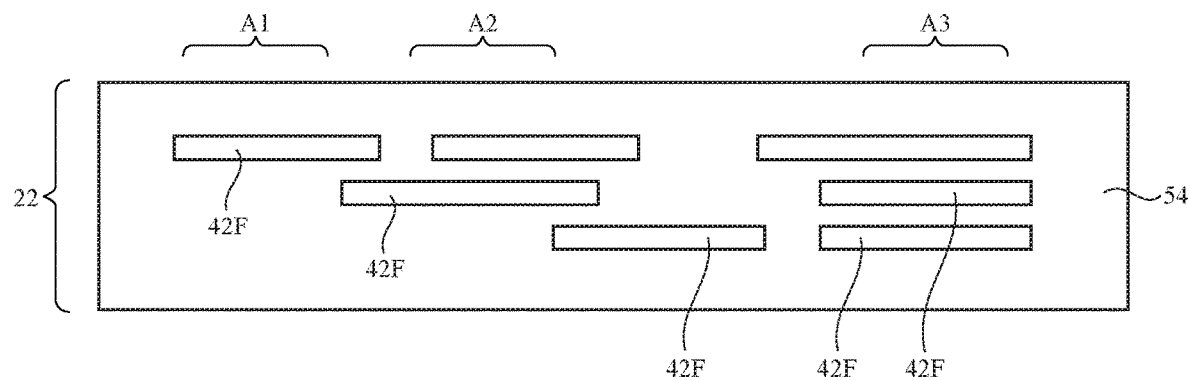
FIG. 15 is a cross-sectional side view of a flake pigment coating layer with overlapping pigment flakes in accordance with an embodiment.

Flakes 42F may overlap by varying amounts in coating 22. For example, some areas of coating 22 such as area A1 of FIG. 15 may have only a single non-overlapped flake 42F between the upper and lower surfaces of layer 54. Other areas such as area A2 may contain two overlapping flakes 42F. Illustrative area A3 of FIG. 15 has three overlapping flakes 42F. Other areas of coating 22 may have four or more overlapping flakes 42F or may be free of flakes 42F.

Figure 16:
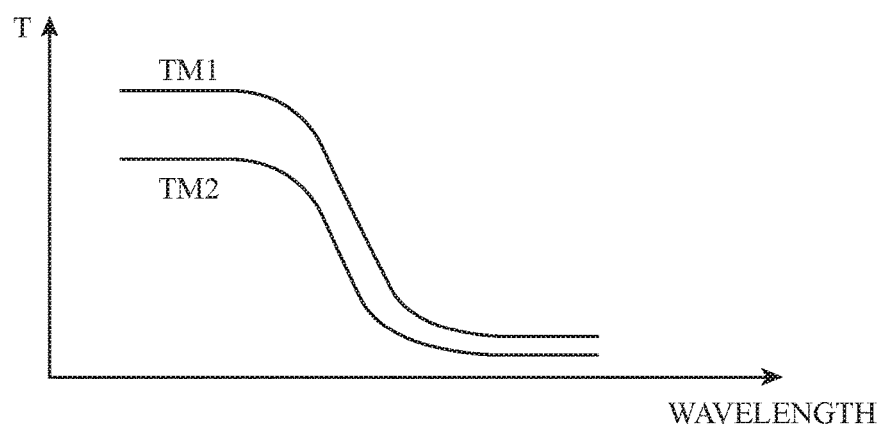
FIG. 16 is a graph of light transmission versus wavelength for illustrative single-flake and overlapping dual-layer flake coating regions in accordance with an embodiment.

If desired, the thickness of coating 22 may be selected to control flake overlap (e.g., so that the average number of overlapping flakes 42F is 1.5-2.5 overlapping flakes per unit area, at least 1.7 overlapping flakes per unit area, less than 2.8 overlapping flakes per unit area, etc.). When flakes 42F overlap, transmission and reflection are affected accordingly. For example, if a single flake 42F has a light transmission characteristic such as curve TM1 of FIG. 16 (with, for example, an 80% visible light transmission), then two overlapping flakes 42F will collectively have a light transmission characteristic such as curve TM2 of FIG. 16 (with, for example, a 64% visible light transmission). The thickness of coating 22 can be selected to take flake overlap into account and thereby ensure that the desired optical properties for coating 22 are achieved.

Figure 17:
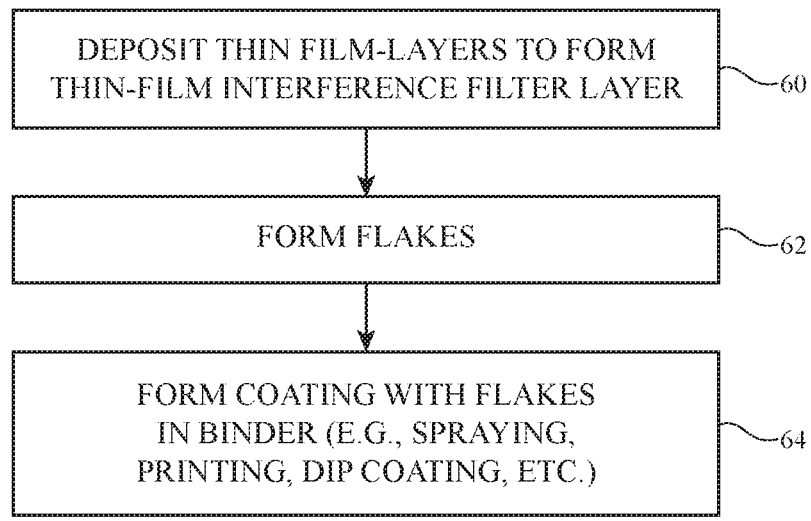
FIG. 17 is a flow chart of illustrative operations involved in forming items with flake pigment coatings in accordance with an embodiment.

Illustrative operations involved in forming items with coatings such as coating 22 are shown in FIG. 17.

During the operations of block 60, physical vapor deposition techniques, chemical vapor deposition techniques, sol-gel techniques, and/or other techniques for depositing layers 38 are used to deposit a desired thin-film dielectric stack of layers 38 on substrate 40. If desired, substrate 40 may be a release liner and layers 38 may be separated from substrate 40.

After forming thin-film layer 42 from layers 38 (and substrate 40, if present), layer 42 can be broken into flakes 42F (block 62).

Flakes 42 can then be mixed into liquid polymer binder 54 and coated onto a structure such as substrate 20 during the operations of block 64 (e.g. using liquid coating techniques suitable for paint and/or ink coatings such as spraying, printing, dip coating, etc.). Ultraviolet light curing, visible light curing, and/or other curing techniques such as thermal curing may be used in curing binder 54 and forming a durable coating 22 with desired optical properties.

In configurations in which coating 22 is formed on a substrate such as a glass layer in an electronic device housing or display, the use of liquid polymer coating techniques may help avoid direct physical vapor deposition of a stack of dielectric layers onto substrate 20, which could weaken the substrate. In flexible substrate applications such as flexible display device 10 of FIGS. 3, 4, and 5, the use of a polymer-based coating such as coating 22 may allow display 14 and coating 22 to bend without cracking coating 22. Curved substrates such as substrate (window) 20 of FIG. 2 may benefit from liquid polymer coating techniques, which may be capable of forming more uniform coating layers than when using coating techniques such as physical vapor deposition techniques to form a coating on a curved substrate.

The foregoing is merely illustrative and various modifications can be made to the described embodiments. The foregoing embodiments may be implemented individually or in any combination.

What is claimed is:

1. An electronic device, comprising:
  a pixel array;
  a glass layer covering the pixel array; and
  an infrared-light-blocking-and-visible-light-transmitting coating on the glass layer that includes pigment flakes in a polymer binder, wherein the pigment flakes include thin-film filter dielectric stacks, wherein each pigment flake contains a stack of at least four inorganic layers with differing indices of refraction, wherein the polymer binder has an index of refraction of less than 1.6, and wherein the infrared-light-blocking-and-visible-light-transmitting coating has a visible light transmission of at least 99%.

2. The electronic device defined in claim 1 wherein the electronic device has a housing, wherein the pixel array and glass layer are mounted in the housing, and wherein images are visible on the pixel array through the glass layer and the infrared-light-blocking-and-visible-light-transmitting coating, and wherein the infrared-light-blocking-and-visible-light-transmitting coating is further configured to block ultraviolet light.

3. The electronic device defined in claim 1 wherein each pigment flake includes a polymer substrate.

4. The electronic device defined in claim 3 wherein the thin-film filter dielectric stacks are formed from inorganic layers on a first side of each polymer substrate and wherein an opposing second side of each polymer substrate is free of the inorganic layers.

5. The electronic device defined in claim 3 wherein the thin-film filter dielectric stacks are formed from inorganic layers on opposing first and second sides of each polymer substrate.

6. The electronic device defined in claim 1 wherein each pigment flake has lateral dimensions of 1-30 microns.

7. The electronic device defined in claim 6 wherein each pigment flake has a thickness of 0.5-3 microns.

8. The electronic device defined in claim 1 wherein the infrared-light-blocking-and-visible-light-transmitting coating is characterized by an infrared light transmission at 700-2500 nm of less than 25%.

9. An electronic device, comprising:
a flexible pixel array; and
an infrared-light-blocking-and-visible-light-transmitting flexible flake pigment coating over the pixel array that includes pigment flakes in a polymer binder, wherein the pigment flakes include thin-film filter stacks, the thin-film filter stacks comprise only dielectric material, and the coating has a transmittance of at least 75% across visible wavelengths.

10. The electronic device defined in claim 9 further comprising a housing configured to bend, wherein the flexible pixel array and the flexible flake pigment coating are configured to bend when the housing bends.

11. The electronic device defined in claim 10 wherein each pigment flake includes a thin-film filter stack that includes at least four dielectric layers.

12. The electronic device defined in claim 11 wherein each pigment flake has lateral dimensions of 1-30 microns and a thickness of 0.5-4 microns.

13. The electronic device defined in claim 11 wherein the flexible pixel array comprises an array of organic light-emitting diode pixels.

14. Apparatus, comprising:
a glass layer; and
an infrared-light-blocking-and-visible-light-transmitting coating on the glass layer that includes pigment flakes in a polymer binder, wherein the pigment flakes include thin-film filter dielectric stacks that are formed from dielectric layers having alternating first and second index-of-refraction values, wherein different portions of the polymer binder across the glass layer have different concentrations of overlapping pigment flakes, and wherein the infrared-light-blocking-and-visible-light-transmitting coating is characterized by an infrared light transmission at 700-1500 nm of less than 25%.

15. The apparatus defined in claim 14 wherein the glass layer has a curved cross-sectional profile.

16. The apparatus defined in claim 15 further comprising a vehicle body in which the glass layer is mounted.

17. The apparatus defined in claim 15 further comprising a building wall in which the glass layer is mounted.

18. The apparatus defined in claim 14 wherein the flakes have width to thickness ratios of at least ten, wherein the thin-film dielectric stack of each pigment flake includes at least four inorganic dielectric layers, and wherein the infrared-light-blocking-and-visible-light-transmitting coating is configured to block ultraviolet light.

* * * * *